United States Patent [19]

Sauer

[11] Patent Number: 4,730,131
[45] Date of Patent: Mar. 8, 1988

[54] INPUT SIGNAL CONDITIONING CIRCUIT

[75] Inventor: Donald J. Sauer, Allentown, N.J.

[73] Assignee: General Electric Company, Schenectady, N.Y.

[21] Appl. No.: 695,297

[22] Filed: Jan. 28, 1985

[51] Int. Cl.$^4$ .............. H03K 17/16; H03K 3/29; H03K 5/01; H03K 5/26

[52] U.S. Cl. .................. 307/443; 307/290; 307/268; 307/510; 307/520

[58] Field of Search .............. 307/443, 520, 510, 262, 307/263, 265, 268, 234, 236, 291, 247 R, 290, 517, 475, 473, 354; 328/109, 167, 111, 114, 118, 119

[56] References Cited

U.S. PATENT DOCUMENTS

| | | | |
|---|---|---|---|
| 3,950,656 | 4/1976 | Sumida et al. | 307/473 |
| 3,953,744 | 4/1976 | Kawagoe | 307/268 |
| 4,258,272 | 3/1981 | Huang | 307/475 |
| 4,267,465 | 5/1981 | Haug et al. | 307/443 |
| 4,286,174 | 8/1981 | Dingwall | 307/354 |
| 4,314,166 | 2/1982 | Bismarck | 307/263 |
| 4,374,331 | 2/1983 | Yamamoto et al. | 307/433 |
| 4,595,845 | 6/1986 | Briggs | 307/443 |
| 4,596,939 | 6/1986 | Yamada | 307/443 |

FOREIGN PATENT DOCUMENTS

58-12677  3/1983  Japan .

*Primary Examiner*—Stanley D. Miller
*Assistant Examiner*—Trong Quang Phan
*Attorney, Agent, or Firm*—Henry I. Steckler; Allen LeRoy Limberg

[57] ABSTRACT

An input signal is applied to first and second logic gates to produce a first output out-of-phase with the input signal and a second output in-phase with the input signal. The first and second outputs are applied to a set/reset flip-flop whose output is applied to a transition detector to produce pulses having a minimum width when the input signal changes level for longer than some predetermined period Tl. The first and second logic gates are designed to have asymmetrical responses whereby input pulses of either polarity having less than the predetermined width Tl are treated as "noise spikes", are effectively filtered from the system, and do not cause a change in the state of the set/reset flip-flop.

10 Claims, 6 Drawing Figures

INPUT SIGNAL CONDITIONING CIRCUIT

This invention relates to means for filtering "noise" on an input signal line and for producing signals having relatively sharp leading and trailing edges and a minimum pulse width.

Some signals are used to initiate and control a series of events in a system. It is therefore necessary that these signals be well defined and that noise pulses (i.e. any pulse having less than some minimum width) appearing on the signal lines be eliminated to prevent false triggering of the system. For example, in many memory systems, read and write cycles are initiated when an address signal changes state. [Typically in these systems the address can change state at any time—i.e., asynchronously with respect to any internal clock.] Each time an address signal changes state its transition is detected. A precharge pulse is then produced and applied to the memory array to place it in a desired condition to ensure that information is written into, or read from, the memory correctly. In addition, numerous housekeeping and sensing functions are generated to read or write information quickly and accurately.

Thus, an address change initiates a series of events involving many components of the system and results in the dissipation of considerable power. The polarity of the address change also causes many of the components of the system to be driven from a first state to, or towards, a second state. Before the memory system can respond to an address change of opposite polarity, time is needed for the system to settle. Consequently it is important that the system responds only to "authentic" signals on the address line. Noise spikes or signals present on the address lines, which have less than a predetermined pulse width, must be eliminated (filtered) to avoid the false triggering of the system.

In circuits embodying the invention, logic gates having an asymmetrical transfer characteristic are used to filter "noise" signals.

In a particular embodiment, an input signal is applied to the input of a first logic gate whose output is applied to the input of a second logic gate. The outputs of the first and second logic gates are then applied to a circuit exhibiting hysteresis to control the state to which it is set. Each one of the first and second logic gates responds faster to a signal at its input going from a first level to a second level than to a signal going from the second level to the first level. The response of the two logic gates is controlled to ensure that their outputs do not change state for a predetermined period in response to signals going from the second-to-the-first level. This feature results in the filtering of pulses whose width is less than the predetermined period.

In the accompanying drawing, like reference characters denote like components, and.

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P-conductivity type are identified by the letter P followed by a particular reference numeral, and enhancement type IGFETs of N-conductivity type are identified by the letter N followed by a particular reference numeral. The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn on the transistor and is greater in magnitude than a given value, which is defined as the threshold voltage ($V_T$) of the transistor. To turn on a P-type enhancement IGFET its gate voltage ($V_G$) has to be more negative than its source voltage ($V_S$) by at least $V_T$. To turn on an N-type enhancement IGFET its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e. the source and drain are interchangeable.

In the discussion to follow, a potential at, or near ground is arbitrarily defined as a logic "0" or "low" condition and any potential at or near $+V_{DD}$ or $+V$ volts is arbitrarily defined as a logic "1" or "high" condition.

Figure 1:
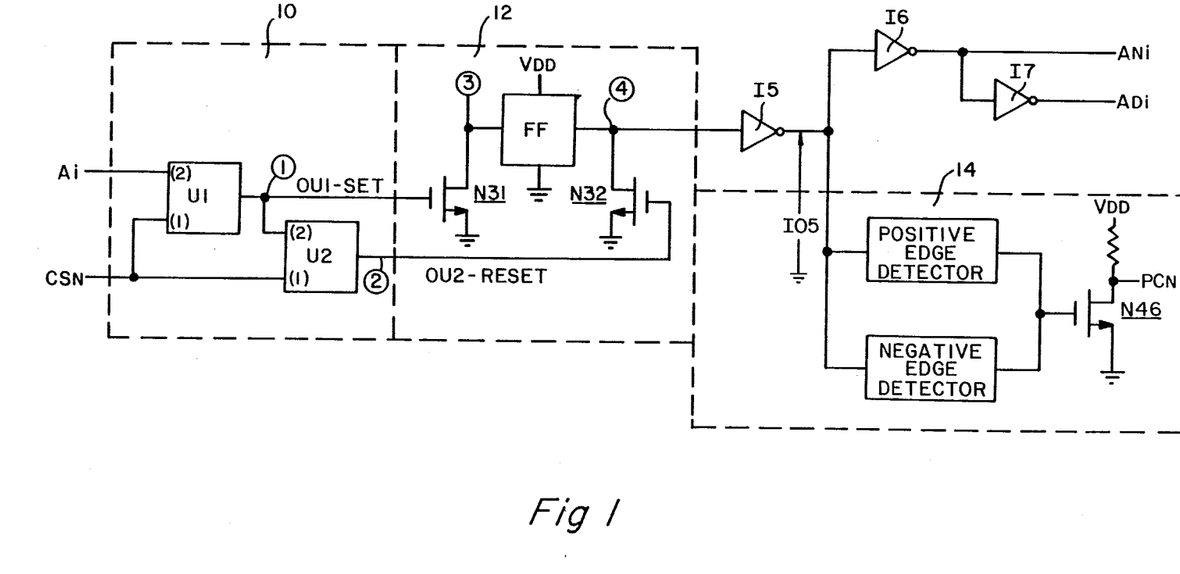
FIG. 1 is a block diagram of a circuit embodying the invention.

The circuit of FIG. 1 includes an input buffer 10, a set-reset (S/R) flip-flop (FF) 12, symmetrical inverters I5, I6 and I7 and a transition detector 14. Input buffer 10 is comprised of two two-input NOR gates U1 and U2. A chip select signal (CSN) is applied to the one (1) input of NOR gate U1 and U2. An address input signal (Ai) is applied to the second (2) input of NOR gate U1 and the output (OU1) of U1 is applied to the second (2) input of U2.

The outputs OU1 and OU2 of gates U1 and U2, respectively, are applied to the set and reset inputs, respectively, of flip-flop (FF) 12. One output (node 4) of FF12 is applied to the input of inverter I5. The output I05 of inverter I5 is applied to the input of edge (transition) detector 14 to produce a negative going precharge pulse (PCN) each time the signal at I05 makes a transition from high-to-low or low-to-high. The output I05 of I5 is also applied to the input of inverter I6 whose output is connected to the input of an inverter I7. A delayed signal ADi in phase with Ai is produced at the output of inverter I7 and a signal ANi which is the complement of ADi is produced at the output of inverter I6.

Figure 2:
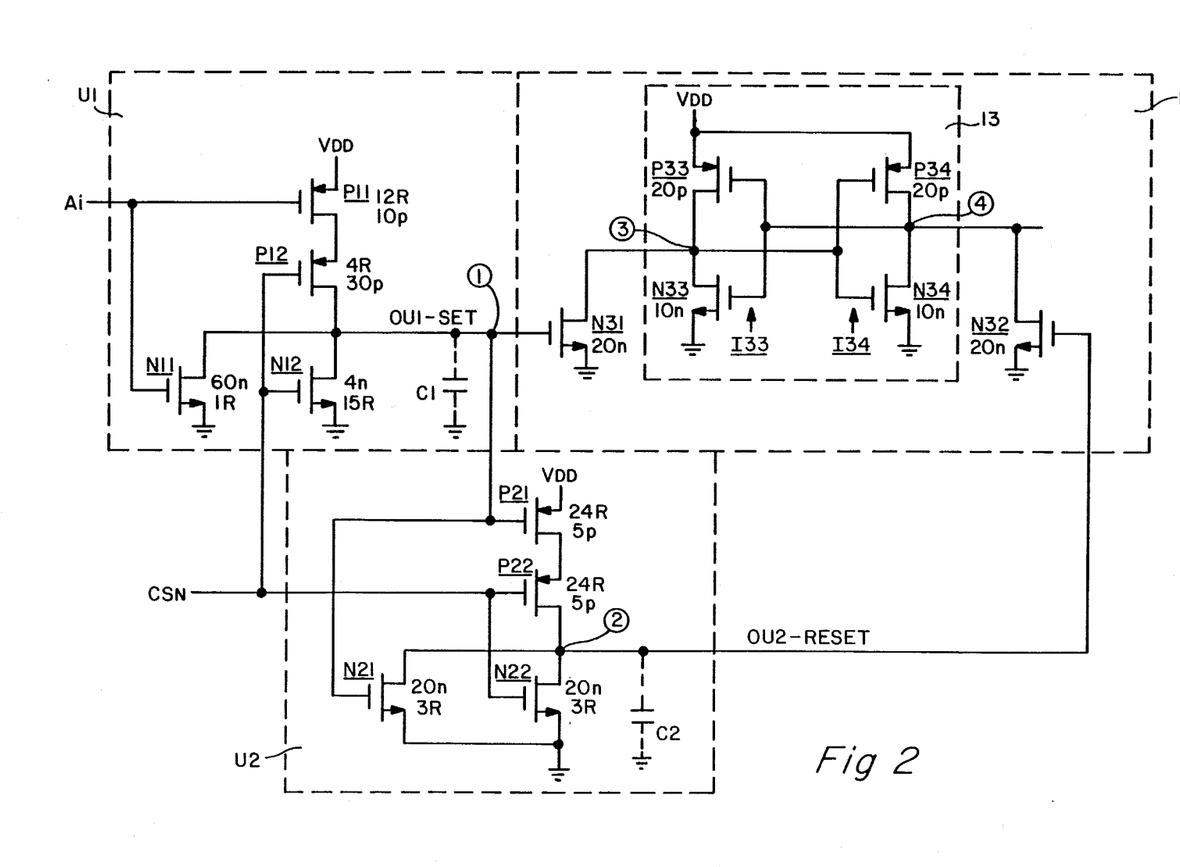
FIG. 2 is a detailed schematic diagram of a portion of the circuit of FIG. 1 embodying the invention.

A detailed schematic representation of NOR gates U1 and U2 and of set-reset FF12 is shown in FIG. 2. Since the devices used in U1 and U2 are sized to provide desirable filter action, their sizes and impedance values are further detailed below.

The sizes (W/L) of the devices (IGFETs) in the circuit of FIG. 2 is indicated by a numeral preceding the letter "n" for N-type devices and the letter "p" for P-type devices. A device of one "n" or one "p" has a width (W) of one micron and length (L) of two microns. Ergo, the larger the numeral associated with a device the larger is its size and the lower is its ON impedance ($Z_{ON}$). Due to differences in their mobility, a P-type device having twice the size of an N-type device is assumed to have the same ON impedance for like values of turn-on bias.

In FIG. 2, the size of the devices is indicated to be as follows: N11 is 60n, N12 is 4n, P11 is 10p, P12 is 30p, P21 and P22 are 5p and N21 and N22 are 20n. Assuming N11 to have an ON impedance of 1R, the ON impedance ($Z_{ON}$) of the other devices relative to one another is approximately as follows: N12 is 15R, P12 is 4R, P11 is 12R, N21 and N22 are each 3R, and P21 and P22 are each 24R, as indicated in FIG. 2. The value of R is typically 250 ohms when the device is fully ON.

N11 is designed to be a much larger device than P11 to cause the $Z_{ON}$ of P11 to be greater thatn that of N11 whereby the output OU1 of U1 goes from high-to-low quickly and much faster than it goes from low-to-high in response to corresponding changes in the input signal Ai. On the other hand P12 is designed to be larger than N12 such that OU1 tends to go from low-to-high faster than it goes from high-to-low, in response to corresponding changes in CSN.

P21 and P22 are small compared to N11 and N22 whereby OU2 goes from high-to-low much faster than it goes from low-to-high for the CSN and OU1 inputs to U2.

The capacitance C1 connected between node 1 and ground represents the total capacitance (discrete or distributed) associated with that node. Similarly, capacitance C2 connected between node 2 and ground represents the total capacitance associated with that node.

S/R flip-flop 13 includes two symmetrical complementary MOS inverters, I33 and I34, which are cross coupled to form a bistable flip-flop 13 which is set and reset via transistors N31 and N32 respectively. Since inverters I33 and I34 are symmetrical, it may be assumed that their flip point is at $V_{DD}/2$ when their operating potential is $V_{DD}$ volts. Thus, when one of the set and reset transistors is turned-on and the other one of the set and reset transistors is turned-off, the one node (e.g. 3) connected to the drain of the turned-on transistor (e.g. N31) is driven below $V_{DD}/2$ and the other node (e.g. 4) connected to the drain of the turned-off transistor (e.g. N32) rises above $V_{DD}/2$. Due to regenerative action, the one node is driven to ground quickly and the other node is driven to $V_{DD}$ quickly.

For example, when OU1 goes from high-to-low and OU2 goes from low-to-high, N31 is turned-off and N32 is turned-on. The turn-on of N32 drives node 4 from $V_{DD}$ volts to $V_{DD}/3$ volts. The voltage drop from $V_{DD}$ to $V_{DD}/3$ at node 4 is applied to the gates of P33 and N33 causing P33 to conduct more than N33 whereby the potential at node 3 rises above $V_{DD}/2$. The voltage rise at node 3 is fed back to the gates of P34 and N34, tending to turn-off P34 and to turn-on N34 causing node 4 to be pulled further below $V_{DD}/3$ and down to ground. Regenerative action continues until node 4 is driven to, or close to, ground and node 3 to, or close to, $V_{DD}$.

In a similar fashion when OU1 goes from low-to-high and OU2 goes from high-to-low, N31 gets turned on and node 3 is driven low while N32 gets turned-off and node 4 is driven high.

Thus, to set node 3 low and node 4 high, N31 must be turned-on and N32 must be turned off. To set node 3 high and node 4 low, N31 must be turned-off and N32 must be turned-on. When N31 and N32 are both turned-off, flip-flop 13 remains in the state to which it was previously set. During normal operation N31 and N32 are not turned-on simultaneously.

It is assumed that a voltage greater than $V_{DD}/2$ must be applied to the gates of N31 and N32 to turn them on so as to drive their respective drain nodes (3 or 4) below $V_{DD}/2$. Thus, in the discussion to follow, when $V_{DD}$ is 5 volts, a low level at OU1 or OU2 is one that is below 2.5 volts and a high level at OU1 or OU2 is one that is above 2.5 volts.

Figure 3:
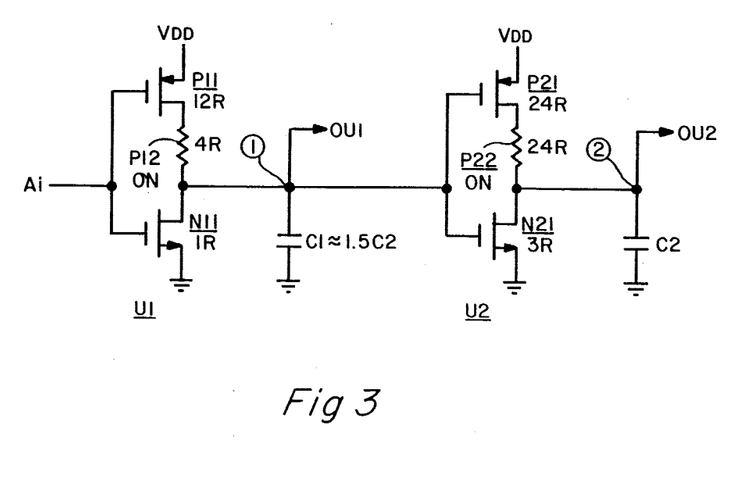
FIG. 3 is a simplified schematic diagram of the circuit of FIG. 2 when the latter is enabled.

The operation of the circuit of FIG. 2 will now be discussed for the condition when CSN is low whereby the input buffer 10 is enabled in that U1 and U2 function as inverters and respond to Ai. When CSN is "low" P12 in U1 and P22 in U2 are turned-on permanently, and N12 in U1 and N22 in U2 are turned-off permanently. Input buffer 10 of FIG. 2 may then be represented by two cascaded inverters as shown in FIG. 3. Thus, in U1, P11 is connected in series with P12, which is permanently ON, between $V_{DD}$ and node 1, and N11 is connected in parallel with N12, which is permanently OFF, between node 1 and ground. Similarly in U2, P21 is connected in series with P22, which is permanently ON, between $V_{DD}$ and node 2 and N21 is connected in parallel with N22, which is OFF, between node 2 and ground.

When CSN is low and Ai is high, P11 is OFF and N11 is ON. The turn-off of P11 cuts off current flow between $V_{DD}$ and node 1 and the turn-on of N11 causes OU1 at node 1 to be discharged to, or close to, ground and thus to go low. When OU1 is low, P21 is turned-on and N21 is turned-off. The turn-on of P21 allows current flow via the series conduction paths of P21 and P22, which is permanently ON, between $V_{DD}$ and node 2 causing OU2 to go high since N21 is turned-off and N22 is permanently OFF. Thus, when Ai is high, OU1 is low and OU2 is high. With OU1-low and OU2-high, flip-flop 13 is reset with node 4 driven low and node 3 driven high.

When CSN and Ai are low, P11 and P12 are turned-on and N11 and N12 are turned-off. Current flows via the conduction paths of P11 and P12 charging node 1 to $V_{DD}$ volts. The "high" at node 1 turns-off P21 and turns-on N21. The turn-off of P21 interrupts current flow between $V_{DD}$ and node 2 and the turn-on of N21 causes node 2 to be discharged to, or close to, ground. The high at node 1, turns-ON N31, and the low at node 2 turns-OFF N32. When N31 is ON and N32 is OFF, node 3 of FF13 is driven low and node 4 is driven high as described above. Clearly in the steady state condition for CSN low, OU1 produces a signal out-of-phase with Ai and OU2 produces a signal in-phase with Ai.

When CSN is "high", P12 and P22 are turned-off, and N12 and N22 are turned-on clamping nodes 1 and 2 to ground regardless of the value of Ai (i.e. whether Ai is high or low). Thus, for CSN high, input buffer 10 is "disabled" with OU1 and OU2 being driven low and FF12 remaining in the state to which it was set when one of OU1 and OU2 was high and the other one was low.

The state of OU1, OU2, node 3 and node 4 as a function of CSN and Ai is summarized in Table I below.

TABLE I

| CSN | Ai | OU1 | OU2 | Node 3 | Node 4 |
|-----|----|-----|-----|--------|--------|
| LO  | HI | LO  | HI  | HI     | LO     |
| LO  | LO | HI  | LO  | LO     | HI     |
| HI  | HI | LO  | LO  | Remains in previous state | |
| HI  | LO | LO  | LO  |        |        |

With reference to FIG. 2, it will now be shown that the sizing of the devices forming U1 and U2 ensures that S/R FF12 does not change state when CSN goes from the low-(i.e. enable)-state to the high-(i.e. disable)-state.

1. Assume that, prior to the low-to-high transition of CSN, Ai is low, whereby OU1 is high, OU2 is low, node 3 is low and node 4 is high. Assume further that Ai does not change during the transition of CSN. When CSN goes from low-to-high the following occurs:

(a) OU1, which was high, is driven low relatively slowly as P12 is being turned-off and N12 is being turned-on, since OU1 is being discharged to ground via N12 which is a small device.

(b) OU2, which was low (due to OU1 being high), remains, and is held, low since N22 is a relatively large device and is turned on quickly by CSN. Since OU1 goes low, P21 is turned-on. But the turn-on of P21 is delayed due to the long time it takes N12 to discharge C1. Thus when P22 is turned-on, P21 is off and N22 is ON maintaining OU2 low.

(c) When OU1 goes from high-to-low with OU2 low, N32 which was off remains off while N31 which was ON is now turned-off. FF13 remains in the state to which it was previously set; i.e., nodes 3 and 4 remain low and high, respectively. The turn-off of N31 in the absence of the turn-on of N32 does not affect the state of FF13.

2. If Ai was high prior to CSN going from low-to-high, OU1 is low, OU2 is high, node 3 is high and node 4 is low. Assume, as above, that Ai does not change during the transition of CSN. On the transition of CSN from low-to-high the following occurs:

(a) OU1 which was low remains low and N31 remains turned-off.

(b) OU2 which was high is now driven low by the turn-off of P22 and the turn-on of N22; OU2 goes low relatively quickly since N22 is a relatively large device and N32 which was ON is turned-off.

(c) Node 3 remains high and node 4 remains low when N32 is turned-off. Hence nodes 3 and 4 do not change state when CSN makes a transition from a low (enable) to a high (disable) condition, and FF13 does not change state.

When CSN goes from the disable (High) to the enable (low) condition, FF13 is set to a state corresponding to the value of Ai, or FF13 remains in its previous state if Ai has the same value it had when CSN was originally low, went high and then low again.

When CSN is low the schematic diagram of U1 and U2 may be represented by the circuit of FIG. 3 which is used to highlight the asymmetric response of U1 and U2. To better understand the discussion of the transient response of the circuit of FIG. 3, to follow, note that the capacitance C1 associated with node 1 is approximately 1.5 times the value of the capacitance C2 associated with node 2.

Note that when Ai goes from low-to-high, P11 is turned-off and N11 is turned-on and OU1 is discharged to ground through N11 with a "falling" time constant ($\tau_{F1}$) of 1R.C1. As OU1 goes negative P21 is turned-on and N21 is turned-off. Hence, after a brief delay, OU2 is charged towards $V_{DD}$ through P21 and P22 with a "rising" time constant ($\tau_{r2}$) of 48R.C2 which is equivalent to 32R.C1. Thus while OU1 goes from high-to-low quickly in less than 0.5 nanoseconds, OU2 goes from low-to-high slowly and does not reach $V_{DD}/2$ until at least 5 nanoseconds have elapsed from the positive transition of Ai. The controlled rise time at OU2 prevents a change in level in OU2 until the desired time delay has elapsed.

When Ai goes from high-to-low P11 is turned-on and N11 is turned-off and OU1 is charged towards $V_{DD}$ through P11 and P12 with a "rising" time constant ($\tau_{r1}$) of 16R.C1. Thus it takes OU1 at least 2.5 nanoseconds to go from 0 volts to $V_{DD}/2$. As OU1 goes positive P21 is turned-off and N21 is turned-on and OU2 is discharged to ground with a "falling" time constant ($\tau_{f2}$) of 3R.C2 which is equivalent to 2R.C1. As further detailed below the asymmetric transfer characteristic of U1 and U2 whereby their rise times ($\tau_{ri}$) is much longer than their fall times ($\tau_{fi}$) ensures that short noise spikes on Ai are eliminated from the circuit. Furthermore the relationship between the rise and fall times of U1 and those of U2 ensures that false triggers are not generated by FF12 also as detailed below.

The controlled rise and fall times at the outputs of U1 and U2 in combination with the hysteresis action of S/R FF12 ensures that any pulse produced at the output of inverter I5 is at least 2 nanoseconds wide. This is best understood by further analysis of the circuit of FIG. 3.

Figure 4A:
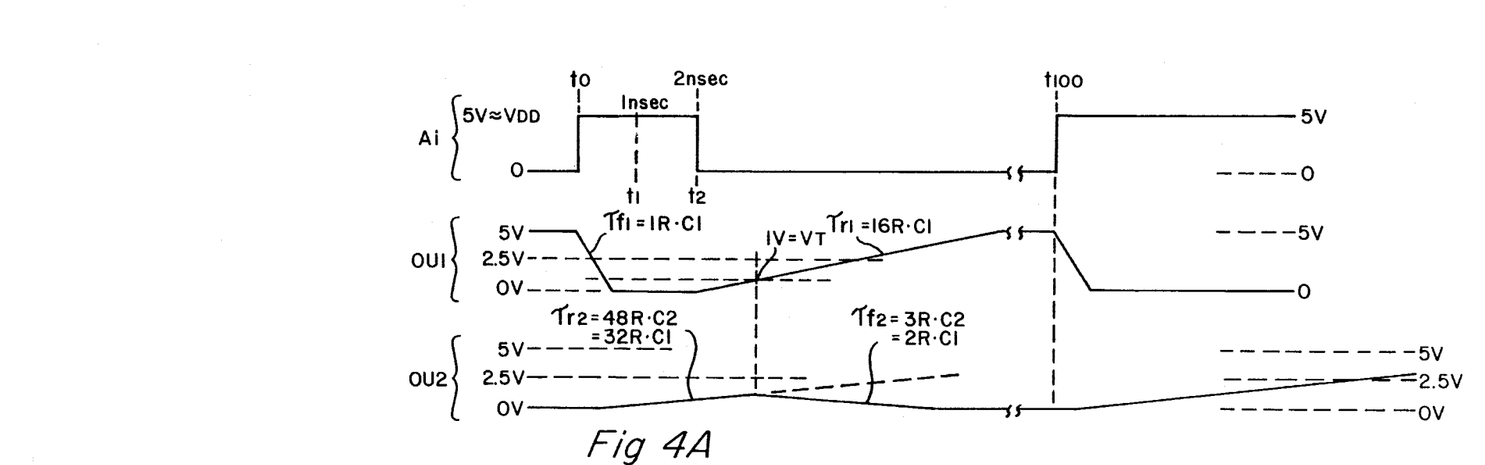
FIGS. 4A and 4B are waveform diagrams illustrating the response of parts of the circuitry of FIGS. 2 and 3.

Assume for example that (with CSN-low) Ai goes from low-to-high and back to low in less than 2 nanoseconds as shown in FIG. 4A. When Ai goes positive, OU1 responds relatively quickly and C1 at node 1 is discharged to ground via N11 within approximately 0.5 nanoseconds. Although OU1 goes low almost immediately after Ai goes high, OU2 rises relatively slowly since C2 charges towards $V_{DD}$ via P21 and P22 with a $\tau_{r2}$ of 48R.C2. The relatively high ON impedances of P21 and P22 limit the current charging C2. Assume that OU1 rises towards $V_{DD}$ at the rate of approximately 1.0 v per nanosecond and that OU2 rises towards $V_{DD}$ at the rate of approximately 0.5 volts/nanosecond. Thus for OU2 to rise from 0v to 2.5 volts takes approximately 5 nanoseconds, where $V_{DD}$ is equal to 5 volts and $V_{DD}/2$ is equal to 2.5 volts. Thus at the end of 2 nanoseconds, at time $t_2$, OU1 is low and OU2 is effectively low since it is below 2.5 volts. If Ai returns to the low level within 2 nanoseconds of its going high, OU1 is then driven positively towards $V_{DD}$ by means of P11 and P12. As long as OU1 reaches $V_T$ volts before OU2 reaches 2.5 volts OU2 will remain low (below 2.5 volts). Once OU1 reaches $V_T$ volts before OU2 reaches 2.5 volts OU2 is quickly driven to ground while OU1 continues to rise towards $V_{DD}$. Thus OU2 is held at the low level, in response to a positive noise spike at the Ai input, by making P21 and P22 smaller devices than P11 and P12 and ensuring that the rise time ($\tau_{r2}$) at node 2 is longer than the rise time ($\tau_{r1}$) at node 1. Thus, in response to a positive noise spike at the Ai input, OU2 does not change state. Ai has to be "high" for more than 2 nanoseconds for OU2 to follow and go positive, in-phase with Ai.

Thus, in response to a narrow (2 nanoseconds or less) positive going pulse on the address line, OU2 remains in the low state (i.e. below 2.5 volts), while OU1 goes from the high-to-the low state and back to the high state.

As noted above, S/R FF12 does not change state when its two inputs (OU1 and OU2) go low. Thus, when OU1 goes from high-to-low, while OU2 remains low, node 3 remains low and node 4 remains high. When, subsequently, OU1 goes back high, nodes 3 and 4 certainly remain low and high, respectively. Thus, for the condition when Ai-low goes positive for less than 2 nanoseconds, OU1 and OU2 are driven low with OU1 returning to the high level and OU2 remaining at the low level. The positive going spike is thus effectively filtered from the system. Thus NOR gates U1 and U2 in combination with the hysteresis action of FF12 function to filter positive going noise spikes on the address line.

Figure 4B:
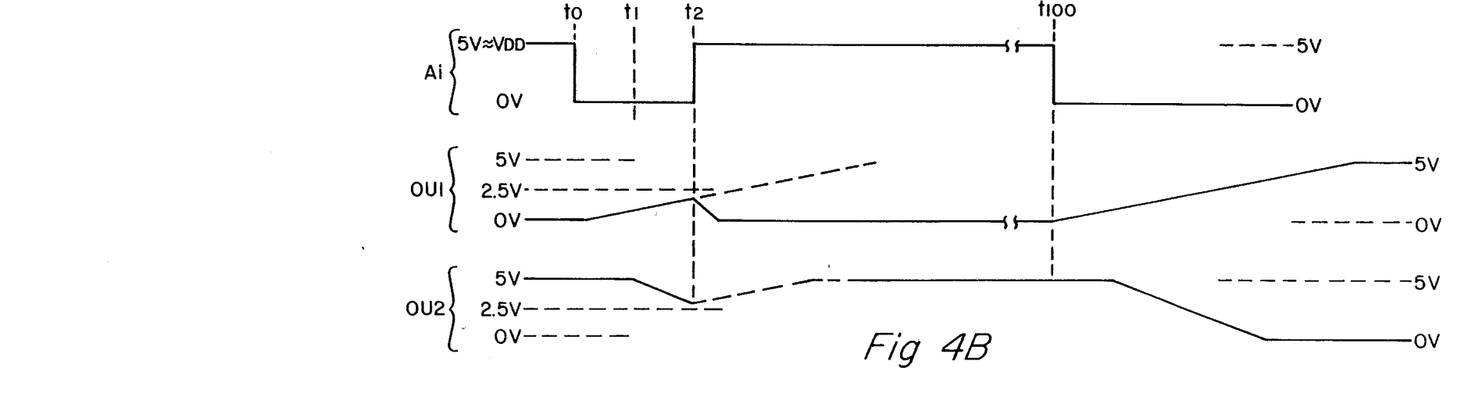

It can similarly be shown that negative going spikes of less than 2 nanoseconds duration on the address line are filtered from the system. As shown in FIG. 4B, when Ai goes negative, OU1 begins to rise towards $V_{DD}$ at the rate of 1.0 volt per nanosecond. Thus at the end of 2 nanoseconds OU1 will be at 2 volt, which is less than the 2.5 volts necessary to turn-on N31 and to drive node 3 low. Concurrently, when OU1 reaches 1 volt (assumed equal to $V_T$ volts) N21 is being turned-on discharging node 2 to ground at the rate of approximately 1 volt per nanosecond. Thus at the end of 2 nanoseconds OU1 is at 2 volts (which is still low) and OU2 is at 3 volts (which is still high). When Ai goes positive, at t=2 nanoseconds, OU1 is quickly driven back to ground while OU2 is recharged to $V_{DD}$. However, since OU1 remained low and OU2-high, the state of the flip-flop has not changed and the negative pulse of a duration of 2 nanoseconds, or less, is filtered out of the system.

Thus the appropriate sizing of the devices forming NOR gates U1 and U2 generate different rise and fall times, which, in combination with FF12, enable "noise" pulses to be "digitally" filtered out of the system.

The signal V5 produced at the output of inverter I5 is applied to a transition or edge detector 14. A transition detector which is particularly useful in practicing the invention is detailed in FIG. 5.

Figure 5:
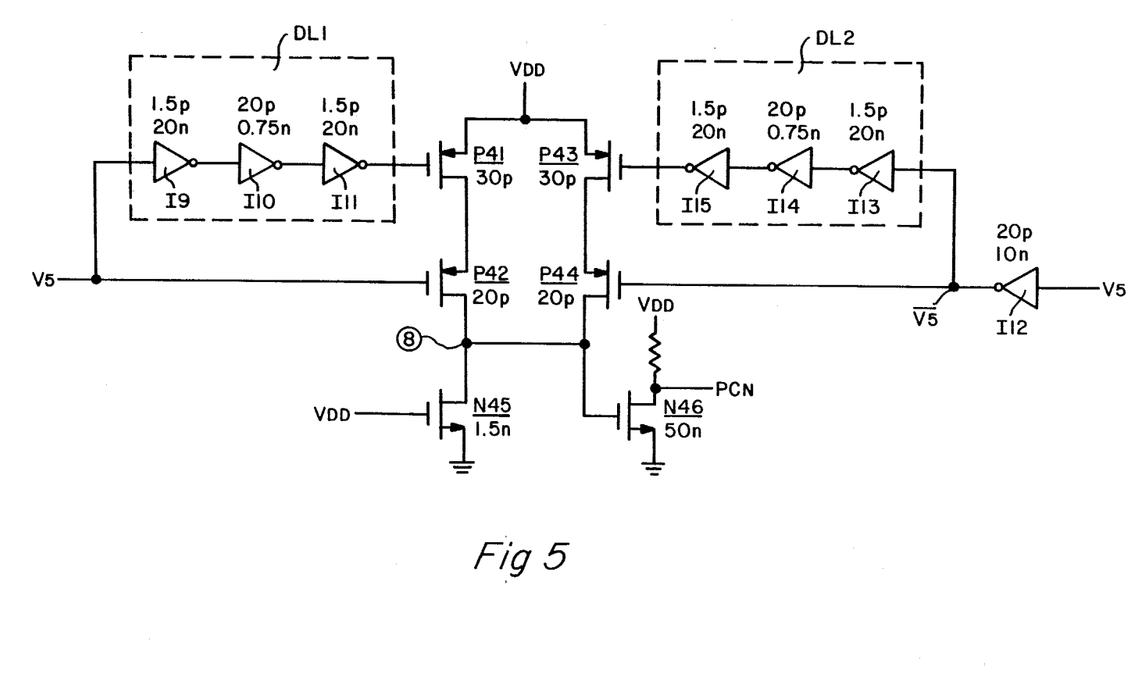
FIG. 5 is a schematic diagram of an edge (i.e. transition) detector which may be used to practice the invention.

A version of transition detector 14 is described in U.S. Pat. No. 4,286,174 entitled Transition Detector Circuit issued to A. G. F. Dingwall and assigned to the assignee of this application. Hence the operation of the detector need not be greatly detailed. Suffice it to say that when V5 is high, $\overline{V5}$, produced at the output of I12, is low. Hence P42 is turned-off and P44 is turned-on. Concurrently V5 high causes a "low" to be applied to P41 turning-it-ON and a "high" to be applied to P43 turning-it-off. Thus, with V5 high, P41 is ON while P42 is OFF and P43 is OFF while P44 is ON.

When V5 makes a transition from high to low, P42 is immediately turned-on and a positive pulse is produced via the conduction paths of P41 and P42. The low-V5 signal is propagated via "skewed" inverters I9, I10 and I11 comprising delay line (DL1) and P41 is turned off some delay time, TD1, after V5 goes from high to low. Thus when V5 is low P41 is OFF and P42 is on.

Concurrently the high to low transition of V5 causes $\overline{V5}$ to go from low to high turning off P44. The low to high transition of $\overline{V5}$ is propagated via "skewed" inverters I13, I14 and I15 forming delay line DL2 to turn-on P43. But since P44 is already off there is no conduction via P43 and P44. Thus the combination of delay line DL1 with P41 and P42 comprise the negative edge (transition) detector; i.e. they produce a pulse at node 8 whenever V5 makes a high to low transition.

When V5 makes a positive going transition from low-to-high P42 is turned off immediately, preventing conduction when P41 is subsequently turned on. However $\overline{V5}$ goes from high to low turning on P44. Since P43 is on, a positive pulse is produced at node 8 via the conduction paths of P43 and P44. A time delay, DL2, after $\overline{V5}$ goes low, a positive level is produced at the output of I15 turning off P43. Thus delay line DL2 in combination with P43, P44 and inverter I12 function as the positive edge (transition) detector.

Whenever a positive pulse is produced at node 8, N46 is turned-on and produces a negative going precharge pulse, PCN, at its drain.

The sizing of the inverters in delay lines DL1 and D2 driving P41 and P43 ensure that the precharge pulses PCN will have a pulse width of typically 15 nanoseconds.

Typically, when V5 goes high, a low is produced at the output of inverter I11 within 3 nanoseconds and a high is produced at the output of I15 within 15 nanoseconds. When V5 goes low, a high is produced at the output of I11 within 15 nanoseconds and a low is produced at the output of I15 within 4 nanoseconds.

What is claimed is:

1. The combination comprising:
   a signal input terminal;
   first and second asymmetrically responsive logic gates, each logic gate having a signal input node and a signal output node;
   means connecting the signal input node of said first logic gate to said signal input terminal and the output node of said first logic gate to the input node of said second logic gate;
   said first and second logic gates being asymmetrically responsive in that they respond faster to signals at their signal input nodes making a transition from a first level-to-a-second level than to signal making a transition from the second level-to-the-first level;
   a set/reset flip flop having a set input and a reset input and exhibiting hysteresis;
   means connecting said set input to the signal output node of said first and second logic gates; and
   means connecting the reset input to the signal output node of the other one of said first and second logic gates for combining the asymmetric response of said first and second logic gates with the hysteresis response of said set/reset flip-flop and digitally filtering "noise" pulses present at said signal input terminal and preventing said set/reset flip-flop from changing state in response to said "noise" pulses.

2. The combination as claimed in claim 1 wherein each one of said first and second logic gates has a second, control input, node; and
   further including means for applying the same control signal to said second control input nodes of said first and second logic gates.

3. The combination as claimed in claim 2 wherein for a first value of said control signal said first and second logic gates are disabled in that the signal output nodes of said first and second logic gates are driven to a given one of said first and second levels regardless of the value of the input signal at said signal input terminal; and wherein for a second value of said control signal said first logic gate is responsive to the value of the signal at said signal input terminal, and said second logic gate is responsive to the value of the signal at the signal output node of said first logic gate.

4. The combination as claimed in claim 1 wherein said first and second logic gates are comprised of complementary metal oxide semiconductor (CMOS) transistors.

5. The combination comprising:
a first gate asymmetrically responsive to an input signal and to a control signal for producing at its output a first output signal having a relatively slow rise time, $\tau_{r1}$, and a relatively fast fall time, $\tau_{f1}$ whereby $\tau_{r1}$ is longer than $\tau_{f1}$;
a second gate asymmetrically response to said control signal and to said first output signal for producing at its output a second output signal having a relatively slow rise time $\tau_{r2}$ and a relatively fast fall time $\tau_{f2}$ whereby $\tau_{r2}$ is longer than $\tau_{f2}$;
wherein the relationship between said first and second gates is such that $\tau_{r2}$ is slower than $\tau_{r1}$; and
a set/reset flip-flop exhibiting hysteresis having a set input connected to said output of said first gate and a reset input connected to said output of said second gate for combining the asymmetric response of said first and second logic gates with the hysteresis response of said set/reset flip-flop and digitally filtering "noise" pulses present at said signal input terminal and preventing said set/reset flip-flop from changing state in response to said "noise" pulses.

6. The combination as claimed in claim 5 wherein the relationship between the first and second gates is such that $\tau_{f1}$ is faster than $\tau_{f2}$.

7. The combination as claimed in claim 5 further including a transition detector coupled to said set/reset flip-flop for detecting positive and negative transitions produced by said set/reset flip-flop in response to changes of said input signal and said transition detector for producing a pulse for each transition.

8. The combination comprising:
an input signal terminal for the application thereto of an input signal;
input signal responsive means coupled to said input signal terminal for producing:
(a) a first output signal which is out of phase with said input signal; and
(b) a second output signal which is in phase with said input signal;
a hysteresis circuit having an input coupled to the outputs of said input signal responsive means and having an output for producing thereat a signal having a first level for one value of the input signal and a second level for a second value of the input signal;
a transition detector coupled to the output of said hysteresis circuit for producing a pulse having minimum width each time the output of said hysteresis circuit changes level for a period of time greater than some predetermined period T1; and
wherein the response of said input signal responsive means is asymmetrical for filtering input signal changes and preventing a change in the level at the output of said hysteresis circuit in response to a change in the level of the input signal for a duration wich is less than said predetermined period T1.

9. The combination comprising:
an input signal terminal for the application thereto of an input signal;
filtering means coupled to said input signal terminal and responsive to said input signal for producing in the steady state condition:
(a) a first output signal which is out-of-phase with said input signal; and
(b) a second output signal which is in-phase with said input signal;
a hysteresis circuit having an input coupled to the output of said filtering means and havinq an output for producing thereat a signal having a first level for one value of the input signal and a second level for a second value of the input signal;
said filtering means also being of the type whose transient response is asymmetrical for preventing the signals at its output from changing the state of said hysteresis circuit in response to any changes in the input signal whose duration is less than a predetermined period T1; and
a transition detector coupled to the output of said hysteresis circuit for producing a pulse having a minimum with each time the output of said hysteresis circuit changes level.

10. The combination comprising:
a signal input terminal for the application thereto of signals varying between first and second levels and wherein a pulse at said input terminal having a width which is less than a given time T1 is defined as noise;
a control input terminal for the application thereto of a control signal;
first and second logic gates, each logic gate having a signal input, a control input, and a signal output;
means coupling said control input terminal to said control input of said first and second logic gates;
means connecting said signal input terminal to the signal input of said first logic gate;
means connecting said output of said first logic gate to the signal input of said second logic gate;
a circuit exhibiting hysteresis having a first input connected to the output of said first logic gate and a second input connected to the output of said second logic gate, said hysteresis circuit being set to one state for one condition of the signals at the outputs of said first and second logic gates and being set to another state for a second condition of the signals at the outputs of said first and second logic gates; and
wherein each one of said first and second logic gates is asymmetrical, in that it responds faster to a signal at its signal input making a transition of one polarity than to a signal making a transition of opposite polarity; and to an input signal transition of said one polarity the output of each one of said first and second logic gates remains at or close to one of said first and second levels for at least a time T1 after the signal at its signal input makes a transition of said one polarity.

* * * * *